United States Patent [19]
Randazzo et al.

[11] Patent Number: 5,780,329
[45] Date of Patent: Jul. 14, 1998

[54] PROCESS FOR FABRICATING A MODERATE-DEPTH DIFFUSED EMITTER BIPOLAR TRANSISTOR IN A BICMOS DEVICE WITHOUT USING AN ADDITIONAL MASK

[75] Inventors: Todd A. Randazzo; John J. Seliskar, both of Colorado Springs, Colo.

[73] Assignee: Symbios, Inc., Fort Collins, Colo.

[21] Appl. No.: 832,245

[22] Filed: Apr. 3, 1997

[51] Int. Cl.⁶ .................................................. H01L 21/8238
[52] U.S. Cl. .......................... 438/202; 438/373; 438/376; 438/944; 148/DIG. 9; 257/370
[58] Field of Search ........................... 438/202, 373, 438/376, 944, 219; 148/DIG. 9; 257/370

[56] References Cited

U.S. PATENT DOCUMENTS

| | | | |
|---|---|---|---|
| 4,980,317 | 12/1990 | Koblinger et al. | 437/228 |
| 4,987,098 | 1/1991 | Roberts | 437/34 |
| 5,091,290 | 2/1992 | Rolfson | 430/327 |
| 5,286,607 | 2/1994 | Brown | 430/313 |
| 5,288,652 | 2/1994 | Wang et al. | 437/31 |
| 5,348,897 | 9/1994 | Yen | 437/40 |
| 5,510,287 | 4/1996 | Chen et al. | 437/52 |
| 5,554,548 | 9/1996 | Sundaresan | 437/41 |

Primary Examiner—John Nielbling
Assistant Examiner—Long Pham
Attorney, Agent, or Firm—John R. Ley; Wayne P. Bailey

[57] ABSTRACT

A bipolar transistor with a relatively deep emitter region is formed in a BICMOS device using the source/drain mask used to form the source and drain regions of MOSFETs of the device and the base region mask which would otherwise be required in any event to diffuse an emitter region of the bipolar transistor. The emitter is diffused or implanted to a depth greater than the depth to which a source and a drain region of the MOSFET are diffused. By using only the base region and source/drain region masks, and developing in sequence, each of two coatings of photoresist applied on top of one another, an access opening to the emitter region is define solely by the co-location of openings in each of the two coatings, thereby allowing the emitter region to be separately and additionally implanted. The access to the base region for the additional implication is achieved using only a few additional photo-ops and not as a result of using an additional emitter mask.

15 Claims, 4 Drawing Sheets

PROCESS FOR FABRICATING A MODERATE-DEPTH DIFFUSED EMITTER BIPOLAR TRANSISTOR IN A BICMOS DEVICE WITHOUT USING AN ADDITIONAL MASK

This invention relates to the fabrication of improved performance bipolar transistors in an integrated manner with metal oxide semiconductor field effect transistors (MOSFETS) in a single bipolar complementary metal oxide semiconductor (BICMOS) device or application specific integrated circuit (ASIC). More particularly, the present invention relates to a new and improved process for fabricating the integrated bipolar transistor with a relatively deep emitter to substantially enhance the performance of the bipolar transistor without increasing the number of masks necessary beyond those which are required to form relatively shallow emitter-poor performance bipolar transistors simultaneously with the MOSFETs of the BICMOS device or BICMOS ASIC.

BACKGROUND OF THE INVENTION

Some types of ASICs require the integration of a bipolar transistor along with the MOSFETs which are typically used in most integrated circuits. In certain types of ASICs, MOSFETs are simply not suitable for certain applications, but a bipolar transistor is suitable. In those cases, bipolar transistors are integrated with MOSFETs on a single substrate, and a BICMOS device is the result.

A polysilicon transistor offers the best performance in a BICMOS device. However, fabricating a polysilicon transistor as a part of a BICMOS device adds considerable complexity to the traditional complementary metal oxide semiconductor (CMOS) fabrication processes. For example, fabricating the traditional CMOS device using current technology may require in the neighborhood of approximately twelve or more photo-lithographic masks and approximately fourteen or more photo-lithographic exposure operations (photo-ops) using the masks. Adding the additional polysilicon transistor requires in the neighborhood of four more additional masks and a comparable number of additional photo-ops. The additional masks required to form the polysilicon bipolar transistors add considerably to the development cost of the BICMOS device, because designing and creating each mask represents a significant additional non-recurring engineering (NRE) cost.

If a large number of BICMOS devices are to be manufactured, the additional NRE costs for each additional mask may not be particularly significant because the additional NRE cost can be distributed over the large number of products manufactured. However, in circumstances where only a relatively small lot of BICMOS devices is to be manufactured, or in circumstances where multiple prototype designs are required to evolve the final product, the NRE costs can be prohibitive.

A further practical factor involved in fabricating those semiconductor devices which require a relatively large number of masks is managing the additional number of masks. Each mask must be stored until it is ready for use. Each mask must be loaded into a stepper which positions it during the semiconductor fabrication process, and the application of the masks must be staged in the proper sequence. The requirements for managing the masks can limit the number of product types which an semiconductor fabricator can reliably manufacture. Alternatively, the complexity of mask management may discourage some semiconductor fabricators from producing relatively small quantities of product types or from prototyping new product types. Consequently it is generally beneficial to reduce the number of masks used in the fabrication process.

In contrast to the additional management complexity and NRE costs associated with additional masks, performing additional photo-ops during the fabrication of semiconductor products are not as problematic. Performing photo-ops can be accomplished relatively economically and without significant additional complication during the fabrication process because the masks necessary for the photo-ops are already available and loaded into the steppers. The costs of additional photo-ops are generally quite moderate or almost insignificant compared to the more significant NRE costs of additional masks for relatively small quantities of product types. Consequently, the additional photo-ops generally only contribute to the direct cost of the product, sometimes referred to as the wafer cost, not to the more significant NRE costs associated with additional masks.

In those cases where the superior performance of a polysilicon bipolar transistor is not required in a BICMOS device, it is typical to use diffused emitter bipolar transistors. In general, a diffused emitter bipolar transistor is formed in the BICMOS device by using only a single additional mask beyond those necessary to form the MOSFETs as part of the integrated fabrication process. The additional mask is employed to define a base region of the bipolar transistor. After forming the base region of the bipolar transistor, the mask used in the CMOS process to define the source and drain regions of the n-channel MOSFETs is then used to define the emitter region. The emitter region is then diffused simultaneously with the diffusion of the source and drain regions of the MOSFETs.

While this single additional mask process for creating a diffused emitter bipolar transistor reduces NRE costs and the management difficulties associated with multiple additional masks, the bipolar transistor created by this single mask prior art process has relatively poor operating characteristics. Generally speaking the gain of the transistor is limited to a range which would generally be considered as poor for a bipolar transistor. The frequency characteristics of the bipolar transistor are also limited. The poor gain and limited frequency capability restricts the practical utility of the bipolar transistor.

The relatively poor performance of the bipolar transistor results because the emitter region is diffused to a depth which is relatively shallow. The shallow depth of the emitter results from the fact that its depth must be comparable to the diffusion depth of the source and drain regions of the MOSFETs, since the emitter, source and drain regions are formed simultaneously during the same set in the fabrication process. Consequently, the depth of diffusion is uniform in the emitter, source and drain.

The depth of the source and emitter regions of the MOSFETs primarily controls the fabrication of the BICMOS device. The scaling or design layout criteria for the MOSFETs of the BICMOS device must provide relatively small spaces in the horizontal and the vertical dimensions. Very small scaling criteria is necessary to reduce the size of the BICMOS device, to achieve high performance of the MOSFETs, to obtain greater amounts of circuitry on the BICMOS device, to reduce power consumption, to reduce costs, and in general to be competitive with the current trends toward smaller and smaller scaling criteria. Attempting to increase the vertical depth of the MOSFET source and drain regions, to thereby obtain a deeper emitter region of the bipolar transistor, while still complying with the relatively small scaling criteria would result in an unacceptable level of defective BICMOS devices. Too many short circuits of the source and drain regions to other adjoining regions and components within the BICMOS device would inevitably result, simply as a result of the attempt to increase the depth of the diffusion in relation to the scaling criteria.

Thus, any BICMOS device which requires a moderate or high performance bipolar transistor either is believed not to have been previously achieved using the lower cost, lower complexity additional base mask diffused emitter fabrication process, but has required the considerably more complex and expensive polysilicon bipolar transistor manufacturing process. If a deeper emitter diffused emitter bipolar transistor has been formed in a BICMOS device, it is suspected that the deeper emitter has been formed only as a result of the separate use of an additional emitter mask to separately diffuse the deeper emitter. Of course, the separate emitter mask would increase the NRE costs and the complexity of managing the masks to fabricate the product.

It is with respect to these and other background considerations that the present has evolved.

SUMMARY OF THE INVENTION

It is an aspect of the present invention to allow the fabrication of relatively deep emitter moderate performance bipolar transistors in an integrated manner with MOSFETs in a BICMOS device, using only same number of masks necessary to form the MOSFETs of the BICMOS device, plus the single additional mask to form the base region of the bipolar transistor which would be required in any event when bipolar transistors are integrated with MOSFETs. Other important aspects of the present invention include the following, among others: fabrication of a diffused emitter bipolar transistor in a BICMOS device which has an emitter depth greater than the depths of the source and drain regions of the MOSFETS of the BICMOS device without use of a separate mask to implant the emitter; reduction in the NRE costs for prototyping and manufacturing relatively small lots of BICMOS devices integrate moderate performance bipolar transistors; simplification of the complexity of managing the masks during the process of fabricating BICMOS devices having bipolar transistors of moderate performance; and fabrication of moderate performance bipolar transistors in an integrated manner with MOSFET transistors in a BICMOS device by using only the same number of masks which have previously been necessary to achieve relatively poor performance bipolar transistors in BICMOS devices.

In accordance with these and other aspects, the present invention relates to a process of forming a BICMOS device with an integrated bipolar transistor and a MOSFET using only the source/drain mask and the base region mask which would otherwise be required in any event to diffuse an emitter region of the bipolar transistor to a greater depth than the depth to which a source and a drain region of the MOSFET are diffused. The process involves the steps of exposing, using only the base region and source/drain region masks, and developing in sequence, each of two coatings of photoresist applied on top of one another to define an access opening to the emitter region solely by the colocation of openings in each of the two coatings. Thereafter the process involves implanting the emitter region through the co-located openings to a greater depth than the depth to which the source and drain regions are diffused. The co-location of the openings through the two separately and sequentially applied coatings of photoresist defines an access opening to the emitter region, thereby allowing it to be separately and additionally implanted with an additional amount of material to deepen its penetration into the base region. The access to the base region for the additional implication is achieved using only a few additional photo-ops and not as a result of using an additional emitter mask. The reduction in the number of masks required simplifies the tool management aspects of fabricating BICMOS devices according to the present invention.

In accordance with additional preferred aspects of the present invention, a first portion of the emitter region is implanted simultaneously with implanting the source and drain regions of the MOSFET, and a second portion of the emitter region is implanted to a greater depth than the first portion through the co-located openings. The source and drain regions of the MOSFET and the first portion of the emitter region are also implanted approximately the same depth. Furthermore, the first portion of the emitter region may be implanted prior to implanting the second portion of the emitter region, or the second portion of the emitter region may be implanted prior to implanting the first portion. Further still, the first or the second portion of the emitter region may be implanted either before or after the source and drain regions are implanted.

A higher performance, more deeply diffused emitter bipolar transistor can thereby be formed without use of a separate mask to implant the deeper emitter region. The additional complexity to obtain the more deeply diffused emitter are the performance of a few additional, relatively inexpensive photo-ops. The significant NRE costs of additional masks are avoided, thereby reducing the costs of prototyping and manufacturing relatively small lots of BICMOS devices.

A more complete appreciation of the present invention and its scope may be obtained by reference to the accompanying drawings, which are briefly summarized below, and to the following detailed description of presently preferred embodiments of the invention, and to the claims appended following the detailed description.

DETAILED DESCRIPTION

It is a recognized practice to fabricate a bipolar transistor as a part of a BICMOS device using only a single additional mask to form the base region of the bipolar transistor, and thereafter, to form the emitter region of the bipolar transistor simultaneously with the formation of the source and drain regions of the N-channel MOSFETs of the BICMOS device. The resulting prior art bipolar transistor is shown at 20 in FIG. 1. The prior art BICMOS device or BICMOS ASIC of which the bipolar transistor 20 is a part is shown at 22 in FIG. 2. The BICMOS device 22 includes, in addition to the bipolar transistor 20, at least one and typically two additional MOSFETs because CMOS construction is typically employed. In the example shown in FIG. 2, the BICMOS device 22 includes a N-channel MOSFET 24 and a P-channel MOSFET 26.

Figure 2:
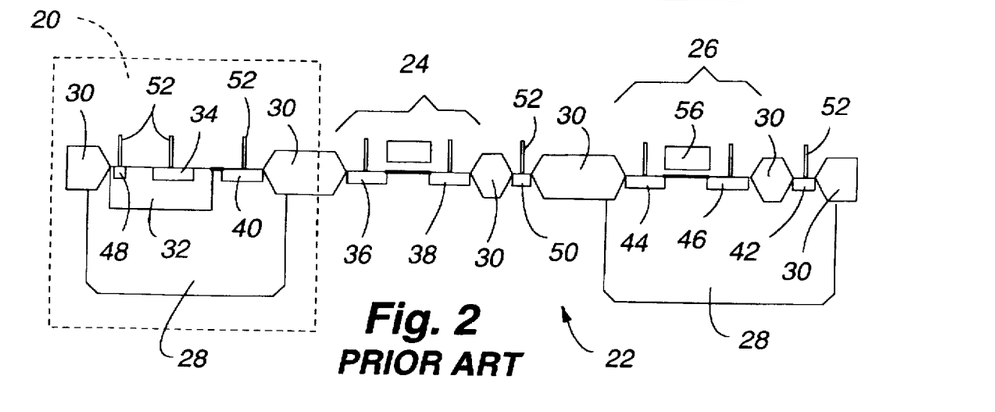
FIG. 2 is a cross-sectional illustration of a BICMOS device into which the prior art bipolar transistor shown in FIG. 1 has been integrated along with MOSFETs.

The BICMOS device 22, including the transistors 20, 24 and 26, is formed on a P type substrate (not shown). N wells 28 are formed in the P type substrate, and the bipolar transistor 20 (as an NPN transistor) and the P-channel transistor 26 are each formed in a N well 28. The transistors 20, 24 and 26, and other regions within the BICMOS device 22, are separated by insulating barriers 30, which are also formed into the P type substrate.

Figure 1:
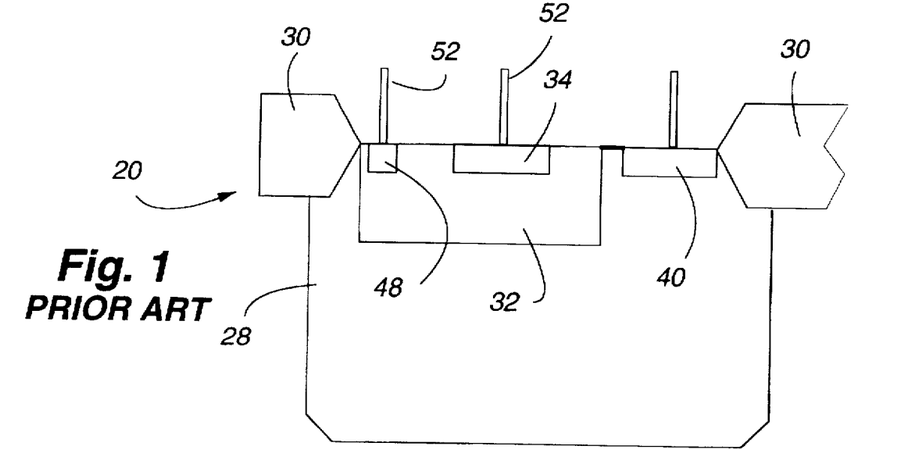
FIG. 1 is a cross-sectional illustration of a prior art bipolar NPN transistor integrated in a BICMOS device.

To form the NPN transistor 20 after the insulating barriers 28 have been formed in the substrate, a base region 32 of P-material is implanted into the N well 28. The base region 32 implementation is conventional and is accomplished by the use of a base region mask (not shown) which is required in the prior art process and which is also required in the process of the present invention. The base region mask is used to expose a layer of photoresist material (not shown) which is coated over the top of the substrate. After exposure and development, the photoresist material remains over all of the substrate except above the location at the N well 28 where the base region 32 is to be implanted. The base region 32 is then implanted by directing the high energy P− species into the N well 28, thus forming the P− base region 32. The depth of the base region 32 is controlled by the time duration and the energy level of the P− species diffusion.

After formation of the base region 32 in the N well 28, the remainder of the bipolar transistor 20 is formed simultaneously with the formation of the MOSFET transistors 24 and 26, as shown in FIG. 2. An emitter region 34 of the transistor 20 is formed simultaneously with a source region 36 and a drain region 38 of the N-channel transistor 24, a collector junction 40 of the bipolar transistor 20, and a N well junction 42 for the P-channel transistor 26. The regions 34, 36 and 38, and the junctions 40 and 42 are formed by N+ material, and these regions and junctions are patterned simultaneously using a single N+ source/drain mask (not shown). The N+ source/drain mask is used to expose a coating of photoresist, and after the photoresist is developed, the areas of the regions 34, 36 and 38 and the junctions 40 and 42 are exposed, these areas are implanted by diffusing N+ species into the substrate and N wells 28 at these areas. Because the emitter region 34 is formed simultaneously with the source region 36 and drain region 38 of the N-channel MOSFET 24, the depth of the diffusion in the emitter region 34 is approximately equal to the depth of the diffusion of the source and drain regions 36 and 38. The emitter region 34 and the source and drain regions 36 and 38 diffuse are approximately the same depth because the diffusion in each region is approximately the same amount because the diffusion occurs at each region for the same amount of time.

Next, a single P+ source/drain mask (not shown) is employed to expose a layer of photoresist, which after its development, is used to form a source region 44 and a base region 46 of the P-channel MOSFET 26, a base junction 48 of the bipolar transistor 20, and a P well junction 50 of the N-channel MOSFET 24. The resulting open areas in the developed photoresist above the regions 44 and 46 and above the junctions 48 and 50 allows P+ material to be diffused simultaneously into the N well 28, the substrate and base region 32 to form the source and drain region 44 and 46, the base junction 48 and the P well junction 50. Because the regions 44 and 46 and the junctions 48 and 50 are formed simultaneously, each of these regions is approximately equal in depth.

The collector junction 40 establishes and electrical connection with the N well 28 of the bipolar transistor 20, and the N well 28 functions as the collector of the transistor 20. Similarly, the base junction 48 establishes an electrical connection with the base region 32 of the bipolar transistor 20. The N well junction 42 establishes an electrical connection with the N well 28 of the P-channel MOSFET 26. The P well junction 50 establishes an electrical connection with the substrate for the N-channel MOSFET 24. Electrical conductors 52 are thereafter attached to the junctions and regions as shown in FIG. 2.

Thereafter, gate regions 54 and 56 are formed to complete the MOSFETs 24 and 26, respectively. The gate regions 54 and 56 are formed after appropriate additional materials and layers (not shown) are formed to complete the BICMOS device 22, as is the conventional practice.

The scaling requirements necessary to minimize the size of the MOSFETs require that the depth of source and drain region diffusions be relatively shallow. Consequently, the depth of the emitter region 34 is also relatively shallow, because the N+ emitter region 34 is formed simultaneously with the formation of, and to the same depth as, the N+ source and drain regions 36 and 38, respectively. The relatively shallow emitter region 34 is responsible for the relatively low gain and the limited high frequency response characteristics of the bipolar transistor 20.

To improve the gain and frequency response of the transistor 20, the depth of the emitter region 34 must be increased. Increasing the depth of the emitter region 34 is not possible if the emitter region 34 is diffused or formed simultaneously with the source and drain regions 36 and 38 and when scaling criteria which determine the size of the MOSFETs do not permit the source and drain regions of the MOSFETs to be increased in depth. Consequently, to increase the depth of the emitter region 34, a separate emitter mask would be required. The separate emitter mask would increase the NRE costs associated with the fabrication of the BICMOS device, and would also complicate the tool management aspects of fabricating multiple product types or would limit the number of different product types that a semiconductor fabricator could build, as well as invoking all of the other considerations which have been described above in the Background of the Invention.

Figure 3:
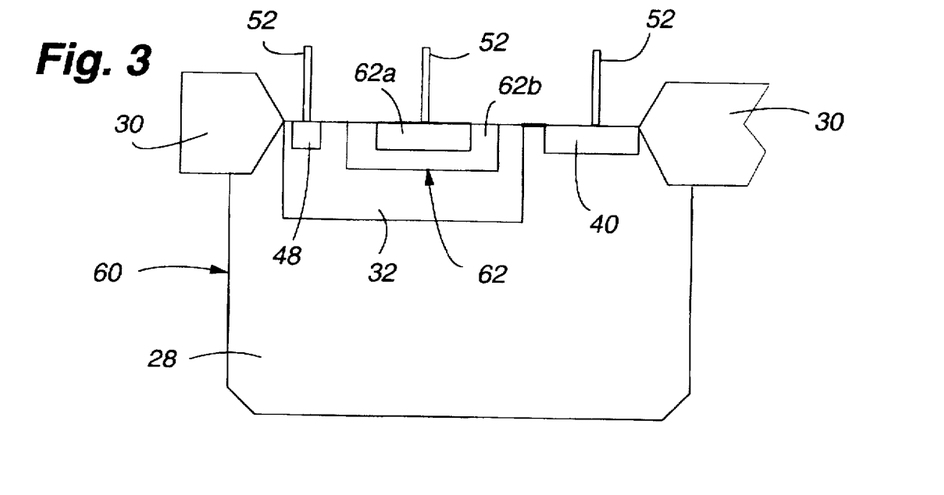
FIG. 3 is a cross-sectional illustration similar that shown in FIG. 1, illustrating an NPN bipolar transistor having a more deeply diffused emitter formed in accordance with the present invention.

The present invention achieves an improved bipolar transistor 60 with a more deeply diffused emitter region 62, as is shown in FIG. 3, without requiring the use of an additional separate emitter mask to obtain the deeper diffusion and depth of the emitter 62, without compromising the scaling of the MOSFETs of the BICMOS device, without incurring additional NRE costs as a result of designing and constructing a separate emitter mask and while simplifying the tool management aspects of fabricating the BICMOS device.

The bipolar transistor 60 includes certain elements which are the same as corresponding elements of the prior art bipolar transistor 20, and those elements are designated by corresponding reference numbers. Similarly, when the improved bipolar transistor 60 of the present invention is integrated in the semiconductor structure of an improved BICMOS device 64 (FIGS. 4–12), the BICMOS device 64 has corresponding elements to the prior art BICMOS device 22 shown in FIG. 2, and those corresponding elements are also designated by corresponding reference numbers.

In general, the deeper emitter region 62 of the transistor 60 is formed of two separate diffusions. One diffusion 62a is formed in a manner generally similar to the single diffusion of the emitter region 34 of the prior art transistor 20 (FIG. 1). However, a another diffusion 62b is separately implanted to extend the depth of the emitter region 62 deeper into the base region 32, thereby improving the gain and frequency response characteristics of the bipolar transistor 60. The increased depth of diffusion of the emitter 62 is achieved by use of the N+ source/drain mask in conjunction with the base region mask in a dual layer photoresist process to result in the exposure only of the emitter region at a step in the fabrication process, thereby allowing the emitter region to be diffused or implanted to a deeper depth as a result of only a few additional and relatively low-cost photo-ops. Three examples of increasing the depth of the emitter region in a bipolar transistor during the fabrication of a BICMOS device without using an additional mask to achieve the additional depth of the emitter are next described in conjunction with FIGS. 4–6, 7–9, and 10–12.

Figure 4:
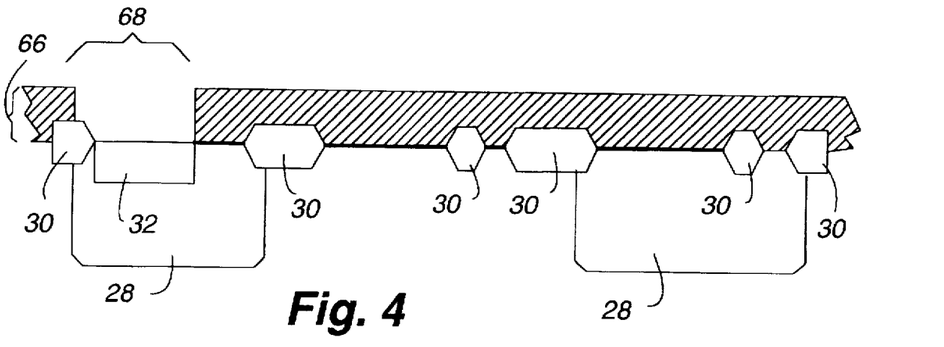
FIGS. 4-6 are cross sectional illustrations of the steps for fabricating the bipolar transistor shown in FIG. 3 in an integrated manner with MOSFETs of a BICMOS device according to a first embodiment of the present invention.

The first example of the process of the present invention begins with the use of the base region mask (not shown) which has been used to pattern a coating 66 of photoresist, as shown in FIG. 4. The coating 66 of photoresist has been applied to the substrate after the insulating barriers 30 and the N wells 28 have been formed. After the coating 66 of photoresist has been exposed and developed, an open space 68 in the photoresist layer 66 is used to implant the P– material of the base region 32. High energy species of the P– material are applied through the open space 68 to diffuse or implant the base region 32 into the N well 28.

After the P– base region 32 as been formed, the coating 66 of photoresist is removed. The P+ material source and drain regions 44 and 46 of the MOSFET 26, the P well drain junction 50 and the base junction 48 are then formed in the conventional manner using the P+ source drain mask (not shown).

Figure 5:
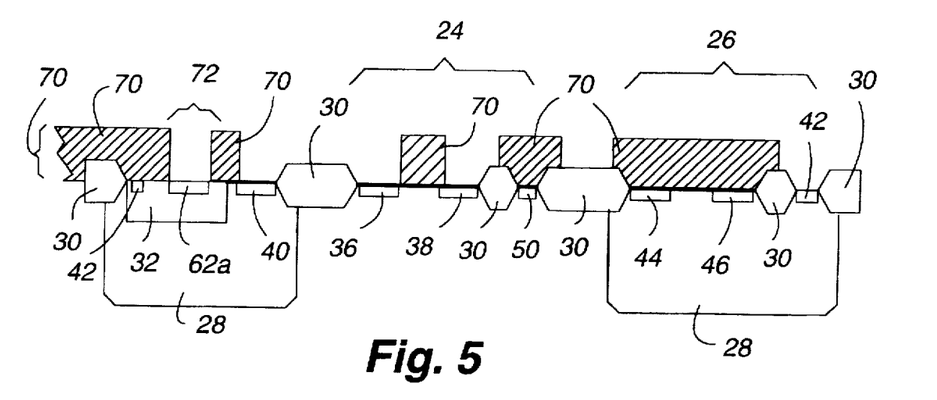

Another coating 70 of photoresist is then applied as shown in FIG. 5. The coating 70 is exposed by use of the N+ source/drain mask. Once exposed and developed, the coating 70 provides open spaces by which to implant the source region 36 and drain region 38 of the N-channel MOSFET 24, the collector junction 40 in the N well 28 of the bipolar transistor 60, and the N well junction 42 of the N well for the MOSFET 26. In addition, the first portion 62a of the emitter region of the bipolar transistor 60 is also formed through an open space 72 located an the coating 70 formed by the N+ source/drain mask. The N+ source/drain mask used to expose the coating 70 of photoresist is the same mask used to perform these functions in fabricating the prior art bipolar transistor 20 and BICMOS device 22 (FIGS. 1 and 2).

Figure 6:
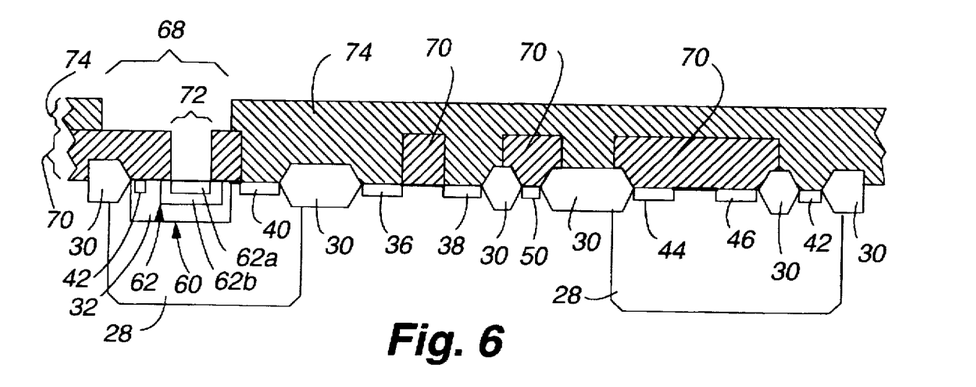

The coating 70 of photoresist is then hard-baked and left in place. Another coating 74 of photoresist is applied and exposed using the base mask employed to form the base region 32 as shown in FIG. 6. Once the coating 74 has been developed, the open space 68 exists above the open space 72. The coating 74 completely covers all of the areas of the BICMOS device which are not covered by the coating 70. Thus, the only open space is through the co-located openings 68 and 72. High energy P+ species are then implanted into the emitter region portion 62a, causing an expansion of the emitter region 62 as encompassed by the outer limits of portion 62b. The portion 62b extends downwardly into the base region 32 to a greater depth than portion 62a, and consequently, to a greater depth than the prior art emitter region 34 (FIG. 1). The emitter region 62 therefore extends to a greater depth than the prior art emitter region 34, because the prior art emitter region 34 will generally be comparable to the depth of only the portion 62a of the emitter region 62 of the transistor formed in accordance with the present invention.

Thereafter, the coatings 70 and 74 of developed photoresist are removed, and the electrical conductors 52 are attached to complete the BICMOS device 64.

It can therefore be seen that the base region mask and the N+ source/drain mask can be used in sequence along with two photo-ops to expose only the emitter region, allowing the emitter region to be implanted twice and therefore achieve a greater depth. The resulting bipolar transistor 60 will have a considerably greater gain and high frequency response characteristics than is possible from the prior art bipolar transistor 20 (FIG. 1), because the depth of the emitter region 62 of the bipolar transistor 60 is greater. These beneficial results are achieved without the use of an additional emitter implementation mask as would otherwise be required to obtain a deeper depth of the emitter region or without forming the bipolar transistor as a polysilicon bipolar transistor.

Figure 7:
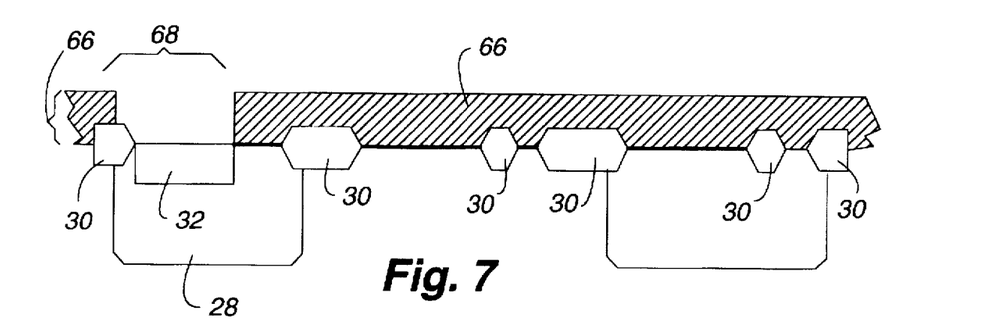
FIGS. 7-9 are cross sectional illustrations of the steps for fabricating the bipolar transistor shown in FIG. 3 in an integrated manner with MOSFETs of a BICMOS device according to a second embodiment of the present invention.
Figure 8:
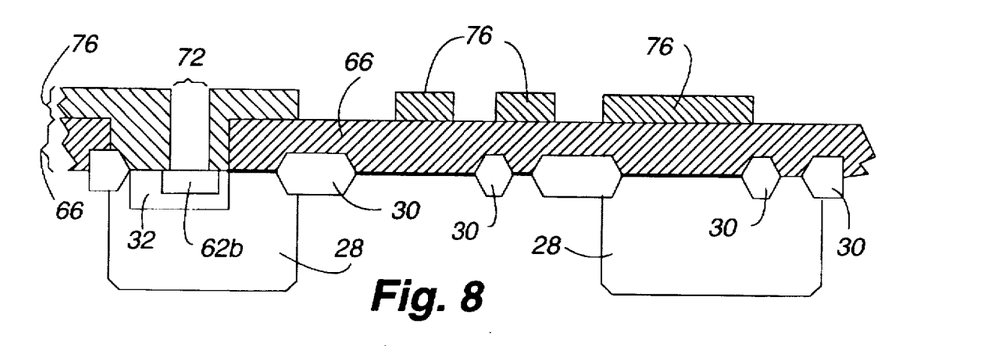
Figure 9:
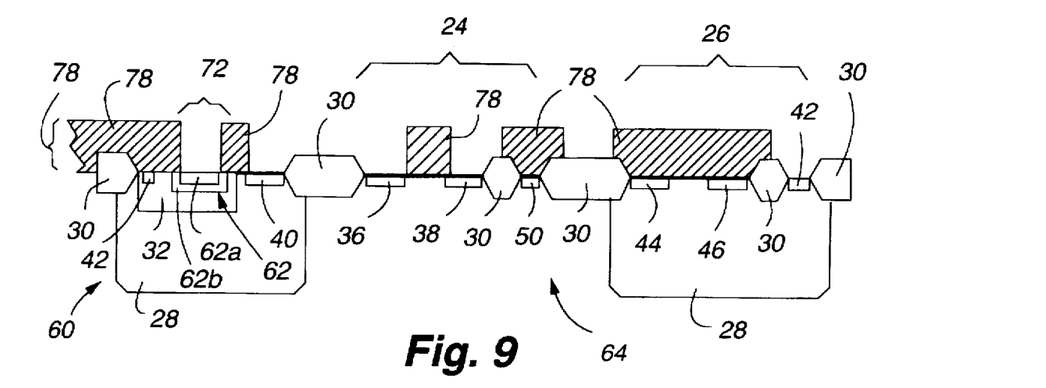

A second example of the process of the present invention is shown in FIGS. 7–9. This second example begins, as is shown in FIG. 7, with the use of the base mask to expose the layer 66 of photoresist and develop it with an open space 68. The base region 32 is thereafter implanted. The steps in the process represented in FIG. 7 are the same as those which have been discussed in conjunction with FIG. 4.

Thereafter, the coating 66 of photoresist is hard-baked in place, and an additional coating 76 of photoresist is placed on the top of the coating 66 and is exposed using the N+ source drain mask (not shown). The opening 68 in the coating 66 is partially filled by the coating 76, but the opening 72 remains co-located with the opening 68 to provide access to the emitter region. The second deeper portion 62b of the emitter region is then implanted into the base region 32 through the opening 72. The time and energy of the N+ species which form the second deeper portion 62b of the emitter region 62 establishes the increased depth of diffusion of the emitter region portion 62b.

Following the formation of the deeper portion 62b of the emitter region 62, the coatings 66 and 76 are removed. The N+ source/drain mask is used to expose a new coating 78 of photoresist which has been applied, as shown in FIG. 9. The coating 78 is developed and results in a situation substantially similar to that previously described in conjunction with FIG. 5. The coating 78 provides open spaces by which to implant the source region 36 and drain region 38 of the N-channel MOSFET 24, the collector junction 40 in the N well 28 of the bipolar transistor 60, and the N well junction 42 to the N well for the MOSFET 26. In addition, the first portion 62a of the emitter region of the bipolar transistor 60 is also formed through the open space 72 located an the coating 70. The first portion 62a is completed by the high energy diffusion of the N+ species into the previously formed second portion 62b. The depth of the first portion 62a is similar to the depths the source and drain regions 36 and 38. The N+ source/drain mask used to expose the coating 78 of photoresist is the same mask used to perform these functions in fabricating the prior art bipolar transistor 20 and BICMOS device 22 (FIGS. 1 and 2).

Thereafter, the coating 78 is removed, and the P+ material is diffused into the substrate to form the source and drain regions 44 and 46 of the MOSFET 26, the P well junction 50 and the base junction 48 in the conventional manner. These regions 44 and 46 and junctions 48 and 50 are formed by the conventional process using the P+ source/drain mask (not shown). Electrical conductors 52 (shown in FIG. 2) are attached to complete the BICMOS device 64.

It is again apparent from this second example of the present invention that the deeper emitter region 62 is obtained using only the base mask and the N+ source/drain mask required for normal fabrication of the prior art BICMOS device 62. Only an additional few photo-ops are required.

Figure 10:
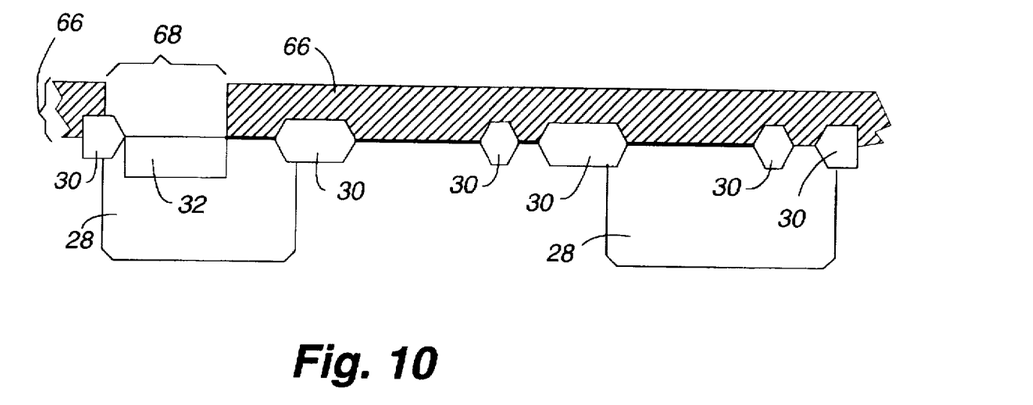
FIGS. 10-12 are cross sectional illustrations of the steps for fabricating the bipolar transistor shown in FIG. 3 in an integrated manner with MOSFETs of a BICMOS device according to a third embodiment of the present invention.
Figure 11:
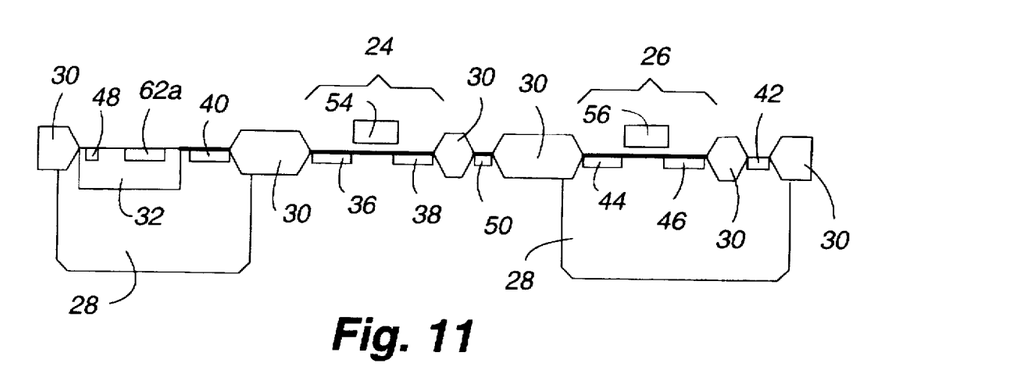
Figure 12:
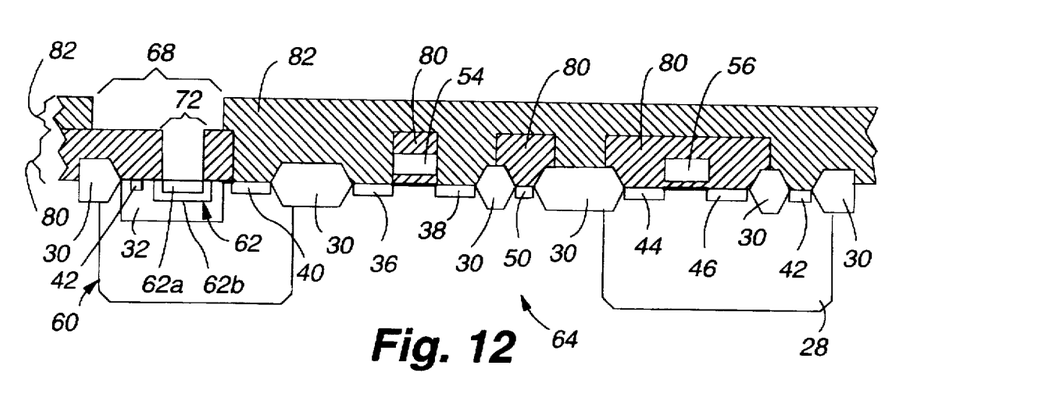

The third example of the process of the present invention is shown in FIGS. 10–12. The first step in the process, shown in FIG. 10, involves the use of the base mask to expose the coating 66 of photoresist, which when developed, provides the open space 68 through which the base region 32 is implanted. The step shown in FIG. 10 is the same as the steps shown in FIGS. 4 and 7.

Next, the BICMOS device 62 is completed in the conventional manner with the formation of a shallow emitter bipolar transistor, as shown in FIG. 11. The shallow emitter of the bipolar transistor results from the initial formation of the first portion 62a of the emitter region, and the resulting bipolar transistor is substantially similar to the prior art transistor 20 shown in FIGS. 1 and 2. The N+ and P+ source/drain masks are employed in the conventional manner to expose coatings of photoresist which, when developed, provide the appropriate openings for implementing the source and drain regions and the junctions.

To advance the BICMOS device into the improved form 64 shown in FIG.12, the deeper emitter of the bipolar transistor 60 within the BICMOS device 62 is formed by using the N+ source/drain mask (not shown) to expose a coating 80 of photoresist material. After development of the coating 80, it is hard-baked, and another coating 82 is placed on top of it. The coating 82 is exposed using the base mask (not shown). As a result of placing the two coatings 80 and 82 on top of one another, access to the emitter portion 62a is provided through the co-located open spaces 68 and 72. Thereafter, the emitter portion 62a is implanted with additional N+ species to form the second deeper portion 62b of the emitter region 62, thereby forming the bipolar transistor 60 with the deeper emitter which results in the improved performance. The portion 62b of the emitter region diffuses both outwardly and downwardly beyond the outer limits of the opening 72, in accordance with the conventional diffusion techniques. 20 Of course, after the bipolar transistor 60 and BICMOS device 64 of the present invention have been formed as shown in FIG. 12, the coatings of photoresist 80 and 82 are removed and the electrical conductors 52 are attached to the regions and junctions.

Of course, the two coatings 80 and 82 shown in FIG. 12 could be reversed in their sequence of application.

In other words, the base region mask could be applied and developed first, causing the pattern of the coating 82 to be in contact with the components of the BICMOS device. Thereafter the pattern the coating 80 could be developed on the top of the coating 82. This opposite sequence of coating applications is generally illustrated by FIG.8.

It is apparent from the preceding description that the process of the present invention is effective to fabricate a more deeply diffused emitter of a bipolar transistor in a BICMOS device, compared to the diffusion depths of the source and drain regions of the MOSFETs which are a part of the BICMOS device. The more deeply diffused emitter region of the bipolar transistor is formed without use of a separate mask to implant the deeper emitter region. The NRE costs of obtaining a separate mask to create the deeper emitter region are avoided, resulting in a reduced cost process for prototyping and manufacturing relatively small lots of BICMOS devices which integrate bipolar transistors of moderate gain. By not requiring an additional mask to obtain the more deeply diffused emitter, the complexity of managing the masks during the fabrication process is greatly simplified. The additional costs to obtain the more deeply diffused emitter are those relatively minor costs associated with an additional few photo-ops. Many other advantages and improvements will be apparent after a complete comprehension of all of the aspects of the present invention.

Presently preferred embodiments of the new and improved process of the present invention have been shown and described with a degree of particularity. These descriptions are of preferred examples of the invention. In distinction to its preferred examples, it should be understood that the scope of the present invention is defined by the following claims, and the scope of this invention should not necessarily be limited to the detailed description of the preferred examples set forth above.

The invention claimed:

1. A process of forming a BICMOS device with an integrated bipolar transistor and a MOSFET, by steps including patterning a semiconductor structure with a source/drain mask and thereafter forming a source and drain region of the MOSFET, and patterning the structure with a base region mask and thereafter forming an emitter region of the bipolar transistor, said process including improved steps to form the emitter region of the bipolar transistor to a greater depth in the structure than a depth to which the source and the drain regions of the MOSFET are formed in the structure, said improvements comprising the steps of:

exposing a first coating of photoresist applied on the structure with one of the base region and source/drain region masks and then developing the first coating;

exposing a second coating of photoresist applied on top of the first coating with the other one of the base region and source/drain region masks and then developing the second coating;

creating individual openings in each of two developed coatings of photoresist after exposing the two coatings with the masks;

defining an access opening to the emitter region in the structure at a co-location of the individual openings in the two coatings;

forming a base region ofthe bipolar forming the emitter region through the access opening to its greater depth in the structure.

2. A process as defined in claim 1 wherein the step of forming the emitter region further comprises the steps of:

implanting a first portion of the emitter region through an individual opening formed in the coating of photoresist with the source/drain mask simultaneously with implanting the source and drain regions of the MOSFET; and implanting a second portion of the emitter region to a greater depth than the first portion through the access opening.

3. A process as defined in claim 2 further comprising the step of:

implanting the source and drain regions of the MOSFET and the first portion of the emitter region to approximately the same depth.

4. A process as defined in claim 2 further comprising the step of:

implanting the first portion of the emitter region prior to implanting the second portion of the emitter region.

5. A process as defined in claim 4 further comprising the step of:

implanting the second portion of the emitter region after the source and drain regions have been implanted.

6. A process as defined in claim 2 further comprising the step of:

implanting the second portion of the emitter region prior to implanting the first portion of the emitter region.

7. A process as defined in claim 6 further comprising the step of:

implanting the second portion of the emitter region prior to implanting the source and drain regions.

8. A process as defined in claim 2 wherein the bipolar transistor is of the NPN type and the MOSFET is of the N-channel type.

9. A process as defined in claim 2 wherein the BICMOS device includes a MOSFET of the N-channel type and a MOSFET of the P-channel type, and said process further comprises the steps of:

implanting one of a region or a junction of each of the P-channel and N-channel MOSFETs simultaneously with implanting the first portion of the emitter region.

10. A process as defined in claim 9 further comprising the step of:

implanting the regions and junctions of the MOSFETs and the first portion of the emitter region to approximately the same depth.

11. A process of fabricating a bipolar transistor having a deeper emitter region than a depth of a source region and a drain region of a MOSFET in a semiconductor structure of a BICMOS device, comprising the steps of:

forming a first opening in a first coating of photoresist by steps including patterning with a base region mask;

exposing the structure through the first opening; transistor in the structure through the first opening;

forming second openings in a second coating of photoresist by steps including patterning with a source/drain region mask;

exposing the structure through the second openings;

forming a first portion of the emitter region and forming the source and drain regions in the structure through the second openings;

applying a third coating of photoresist to the structure after formation of the base region, the first portion of the emitter region and source and drain regions;

creating one of the first and second openings in the third coating of photoresist by steps including patterning the third coating of photoresist with one of the base region mask and the source/drain mask, respectively;

applying a fourth coating of photoresist to the third coating of photoresist after formation of the openings in the third coating;

creating the other one of the first and second openings in the fourth coating of photoresist by steps including patterning the fourth coating of photoresist with the other one of the base region mask and the source/drain mask, respectively;

defining an access opening to the emitter region in the structure at a co-location of the first and second openings in the third and fourth coatings; and forming a second additional portion of the emitter region to expand the emitter region to its greater depth through the access opening.

12. A process as defined in claim 11 further comprising the step of:

forming the source and drain regions of the MOSFET and the first portion of the emitter region to approximately the same depth by implantation.

13. A process as defined in claim 11 further comprising the step of:

forming the first portion and the second portion of the emitter region by implantation.

14. A process as defined in claim 11 further comprising the step of:

forming the second portion of the emitter region by implantation after the source and drain regions have been formed.

15. A process as defined in claim 11 further comprising the step of:

forming the second portion of the emitter region by implantation.

* * * * *

UNITED STATES PATENT AND TRADEMARK OFFICE
CERTIFICATE OF CORRECTION

PATENT NO. : 5,780,329
DATED : July 14, 1998
INVENTOR(S) : Randazzo et al.

It is certified that error appears in the above-indentified patent and that said Letters Patent is hereby corrected as shown below:

Column 10, line 54 delete "forming a base region ofthe bipolar"

Column 11, line 45 delete "transistor in the structure through the first opening;" and replace with -- forming a base region of the bipolar transistor in the structure through the first opening;--

Signed and Sealed this

Twenty-ninth Day of September, 1998

Attest:

BRUCE LEHMAN

*Attesting Officer*     *Commissioner of Patents and Trademarks*